(12) United States Patent
Arita et al.

(10) Patent No.: US 7,678,670 B2
(45) Date of Patent: Mar. 16, 2010

(54) TEG REMOVING METHOD IN MANUFACTURING METHOD FOR SEMICONDUCTOR CHIPS

(75) Inventors: Kiyoshi Arita, Fukuoka (JP); Akira Nakagawa, Saga (JP)

(73) Assignee: Panasonic Corporation, Osaka (JP)

( * ) Notice: Subject to any disclaimer, the term of this patent is extended or adjusted under 35 U.S.C. 154(b) by 312 days.

(21) Appl. No.: 11/660,996

(22) PCT Filed: Dec. 21, 2005

(86) PCT No.: PCT/JP2005/023991

§ 371 (c)(1),
(2), (4) Date: Feb. 23, 2007

(87) PCT Pub. No.: WO2006/068284

PCT Pub. Date: Jun. 29, 2006

(65) Prior Publication Data

US 2007/0264832 A1 Nov. 15, 2007

(30) Foreign Application Priority Data

Dec. 24, 2004 (JP) ............... 2004-373022

(51) Int. Cl.
*H01L 21/301* (2006.01)
(52) U.S. Cl. ............... 438/462; 438/113; 257/E21.523
(58) Field of Classification Search ............ 438/14–15, 438/17–18, 48, 101, 106, 110, 113–114, 438/118, 460, 462–465; 257/48, E21.521, 257/E21.523

See application file for complete search history.

(56) References Cited

U.S. PATENT DOCUMENTS 5,477,062 A 12/1995 Natsume

| | | | |
|---|---|---|---|
| 2002/0111028 A1 | 8/2002 | Arima et al. | |
| 2002/0192928 A1 | 12/2002 | Kosugi | |
| 2004/0102025 A1* | 5/2004 | Arita | 438/460 |
| 2004/0121611 A1* | 6/2004 | Arita | 438/710 |
| 2004/0147097 A1 | 7/2004 | Pozder et al. | |

FOREIGN PATENT DOCUMENTS

| JP | 2001-60568 | 3/2001 |
|---|---|---|
| JP | 2002-231659 | 8/2002 |
| JP | 2003-197569 | 7/2003 |
| JP | 2004-172365 | 6/2004 |

OTHER PUBLICATIONS

Seong-Min Lee, "*LOC Tape Design for Protecting Integrated Circuit Pattern From Damage Due to a Dicing Saw Blade*", Institute of Electrical and Electronics Engineers, 2000 Proceedings 50th. Electronic Components and Technology Conference, ECTC 2000, Las Vegas, NV, May 21-24, 2000, Proceedings of the Electronic Components and Technology Conference, New York, NY, IEEE, US, vol. Conf. 50, May 21, 2000, pp. 1582-1586, XP001054788.

* cited by examiner

*Primary Examiner*—Stephen W Smoot
*Assistant Examiner*—Daren Wolverton
(74) *Attorney, Agent, or Firm*—Wenderoth, Lind & Ponack L.L.P.

(57) ABSTRACT

A semiconductor chip manufacturing process includes sticking a protective sheet onto a first surface of a semiconductor wafer so that the sheet comes in contact with the TEG, placing a mask on a second surface that is a surface opposite from the first surface, performing plasma etching on the second surface to remove portions corresponding to dividing regions and separate device-formation-regions into individual semiconductor chips, and removing the TEG in a state where it remains unremoved in the dividing regions and stuck to the protective sheet together with the protective sheet by peeling off the protective sheet.

9 Claims, 9 Drawing Sheets

TEG REMOVING METHOD IN MANUFACTURING METHOD FOR SEMICONDUCTOR CHIPS

TECHNICAL FIELD

The present invention relates to a manufacturing method for semiconductor chips that include individualized semiconductor devices with a semiconductor wafer, on the first surface of which semiconductor devices are arranged in a plurality of device-formation-regions defined by a dividing regions and a TEG placed in the dividing regions are formed, by individually dividing the device-formation-regions along the dividing regions.

BACKGROUND ART

Conventionally, various manufacturing methods for a plurality of semiconductor chips by dividing such a semiconductor wafer have been known. For example, a method for collectively forming semiconductor devices in a plurality of device-formation-regions provided on a wafer of single-crystal silicon or the like, mechanically cutting (i.e., by dicing) the wafer along dividing regions located between adjacent device-formation-regions and manufacturing semiconductor chips by individualizing the device-formation-regions is known.

Moreover, in such a wafer, an evaluation device, or a test device, that is called TEG, or a Test Element Group, is formed in the dividing regions. In various steps of the semiconductor chip manufacturing process, the actual device characteristics are monitored by investigating various characteristics by means of the thus-formed TEG.

Moreover, it is often the case where such a TEG is formed of a material that contains various kinds of metals and inorganic substances besides silicon and silicon oxide that are generally the principal materials of the wafer. Moreover, the formed TEG becomes unnecessary after the various characteristics are investigated, and the TEG is removed by cutting (dicing) in the stage of wafer dicing along the dividing regions.

Although shrinkage (narrowing) of the dividing regions has been promoted to increase the number of semiconductor chips obtainable per a wafer in recent years, there is a limitation in narrowing the width of the TEG formation region from the viewpoint of reliably carrying out various electrical measurements. Therefore, the dividing regions are narrowed by reducing a gap between the edge portion of the TEG formation region and the edge portion of the dividing regions.

On the other hand, chipping of generating minute fragments or microcrack of generating minute cracks are easily caused by impacts during cutting by a blade during wafer dicing, and therefore, it is necessary to carry out the cutting by the blade in a position located apart from the device-formation-region by some degree. Therefore, if the narrowing of the dividing regions as described above is promoted, it is a case where the TEG cannot completely be removed by the cutting. If the TEG partially remains unremoved a short circuit or the like occurs due to the contact of the TEG with the wiring pattern when the semiconductor chip is mounted, and there is concern that circuit failure might occur.

In order to suppress the occurrence of this problem, various methods have been considered as a method for removing the TEG by cutting, as disclosed in, for example, Japanese unexamined patent publications Nos. 2002-231659 and 2001-60568.

In recent years, plasma dicing using plasma etching has attracted attention as a novel dicing technology for wafer dividing (refer to, for example, Japanese unexamined patent publications Nos. 2004-172365 and 2003-197569). However, it is often the case that the TEG is formed of various metals and inorganic substances unlike silicon and silicon oxide. Accordingly, there is a problem that the TEG cannot completely be removed by the etching and remain unremoved by the plasma dicing (e.g., plasma dicing using a fluorine based plasma) that uses a gas for etching the silicon based material.

Therefore, removing the TEG by etching by performing the etching with the use gas type changed during the plasma dicing has been considered. However, a problem exists that time and labor for changing the gas type of the etching are needed in such a case, and the efficiency of the semiconductor chip manufacturing process is hindered.

SUMMARY OF THE INVENTION

An object of the present invention is to solve the above problems and provide a semiconductor chip manufacturing method capable of dividing a wafer on which TEG is formed into individual pieces of semiconductor chips by using plasma dicing and efficiently removing the TEG.

In accomplishing these and other objects, the present invention is constituted as follows.

According to a first aspect of the present invention, there is provided a manufacturing method for semiconductor chips comprising:

sticking a protective sheet onto a first surface of a semiconductor wafer, on the first surface of which semiconductor devices placed in a plurality of device-formation-regions defined by dividing regions and a TEG, or a test element group, placed in the dividing regions are formed, so that the sheet is brought in contact with the TEG;

placing a mask on a second surface which is a surface located opposite from the first surface of the wafer so as to define the dividing regions;

performing plasma etching on the second surface of the wafer in a state that the protective sheet is stuck to and the mask is placed on, thereby portions corresponding to the dividing regions are removed and then the device-formation-regions are divided into individual semiconductor chips each of which includes the individualized semiconductor device; and removing a remaining portion of the TEG, which remains in the dividing regions and is stuck to the protective sheet, together with the protective sheet by peeling off the protective sheet from the semiconductor chips divided by the plasma etching, thereby the individualized semiconductor chips are manufactured.

Moreover, the semiconductor devices and the TEG are formed mutually separated without being directly connected to each other.

According to a second aspect of the present invention, there is provided the manufacturing method for the semiconductor chips as defined in the first aspect, wherein the mask is removed from the second surface of the semiconductor chips after the plasma etching is performed and before the TEG is removed.

According to a third aspect of the present invention, there is provided the manufacturing method for the semiconductor chips as defined in the first aspect, wherein by performing the plasma etching, the semiconductor chips are separated into individual pieces and the TEG is separated into an individual piece from the semiconductor chips.

According to a fourth aspect of the present invention, there is provided the manufacturing method for the semiconductor chips as defined in the first aspect, wherein the plasma etching is performed on the semiconductor wafer which has a silicon substrate, the semiconductor devices and the TEG formed on the first surface of the silicon substrate, thereby the silicon substrate corresponding to the dividing regions is removed, and then the adjacent semiconductor devices are mutually separated and the TEG is separated from the silicon substrate.

According to a fifth aspect of the present invention, there is provided the manufacturing method for the semiconductor chips as defined in the fourth aspect, wherein the mask is placed on the second surface on the wafer so that a region on the second surface corresponding to a fixation portion of the TEG to the first surface of the silicon substrate is exposed from the mask, and then by performing the plasma etching, the TEG is separated from the silicon substrate by removing the silicon substrate in the fixation portion of the TEG.

According to a sixth aspect of the present invention, there is provided a manufacturing method for semiconductor chips comprising:

sticking a protective sheet onto a first surface of a semiconductor wafer, on the first surface of which semiconductor devices placed in a plurality of device-formation-regions defined by dividing regions and a TEG, or a test element group, placed in the dividing region are formed, so that the sheet is brought in contact with the TEG;

forming groove-portions, along the dividing regions, in portions corresponding to the dividing regions of a second surface located opposite from the first surface of the wafer so that the groove-portions have depths shallower than a thickness dimension of the wafer;

performing plasma etching on the second surface of the semiconductor wafer on which the groove-portions are formed, thereby bottom portions of the groove-portions are removed and then the device-formation-regions are divided into individual semiconductor chips each of which includes the individualized semiconductor device; and removing a remaining portion of the TEG, which remains in the dividing regions and is stuck to the protective sheet, together with the protective sheet by peeling off the protective sheet from the semiconductor chips divided by the plasma etching, thereby the individualized semiconductor chips are manufactured.

According to a seventh aspect of the present invention, there is provided the manufacturing method for the semiconductor chips as defined in the sixth aspect, wherein by performing the plasma etching, the semiconductor chips are separated into individual pieces and the TEG is separated into individual piece from the semiconductor chips.

According to an eighth aspect of the present invention, there is provided the manufacturing method for the semiconductor chips as defined in the sixth aspect, wherein the plasma etching is performed on the semiconductor wafer which has a silicon substrate, the semiconductor devices and the TEG formed on the first surface of the silicon substrate, thereby the silicon substrate corresponding to the dividing regions is removed, and then the adjacent semiconductor devices are mutually separated and the TEG is separated from the silicon substrate.

According to a ninth aspect of the present invention, there is provided the manufacturing method for the semiconductor chips as claimed in the eighth aspect, wherein the groove-portions are formed so as to have width dimensions thereof greater than a width dimension of the fixation portion of the TEG to the first surface of the silicon substrate, and then by performing the plasma etching, the TEG is separated from the silicon substrate by removing the silicon substrate in the fixation portion of the TEG.

According to the aspects of the present invention, the TEG, which is formed in the dividing regions during the semiconductor chip manufacturing process for characteristic investigation, is formed of the materials of silicon and silicon oxide that are the objective materials to be etched by the plasma etching and also of a material that contains, for example, a metal or an inorganic substance different from the materials. Therefore, as a solution to the conventional problem that the TEG cannot be removed depending on the plasma etching for the individualization of the semiconductor chips, by separating the TEG from the respective semiconductor chips by performing the plasma etching and subsequently peeling off the protective sheet for a protection purpose stuck to the first surface of the semiconductor wafer from the surface, the TEG that is adhering to the protective sheet in contact with the sheet can be removed from the dividing region located between the respective semiconductor chips.

Therefore, even when the semiconductor wafer is subjected to the dividing process by the plasma etching, it is possible to obviate the need for performing the plasma etching for the removal of the TEG by purposely changing the gas type and remove the TEG by only carrying out the operation of merely peeling off the protective sheet, allowing the removal of the TEG to be achieved through efficient operation.

Moreover, according to another aspect of the present invention, maskless dicing can be achieved by using groove-portions formed along the dividing regions without using a mask when the plasma etching is performed. By using the maskless dicing, curved convex surface portions can be formed at the corner portions of the manufactured semiconductor chips, so that the semiconductor chips with a high transverse rupture strength can be manufactured.

Moreover, even when the maskless dicing is used, the TEG, which remains unremoved in the respective dividing regions in the state in which they are individualized, can be removed by carrying out the operation of peeling off the protective sheet, so that the removal of the TEG can be achieved by efficient operation.

BRIEF DESCRIPTION OF DRAWINGS

These and other aspects and features of the present invention will become clear from the following description taken in conjunction with the preferred embodiments thereof with reference to the accompanying drawings, in which:

FIGS. 6A through 6D are schematic explanatory views for explaining the steps of the flow chart of FIG. 5: where

FIG. 6 C is a view showing a state in which the formed mask layer is processed to form mask patterns.

FIGS. 7A through 7C are schematic explanatory views continued from FIG. 6D for explaining the steps of the flow chart of FIG. 5: where

FIGS. 9A through 9E are schematic explanatory views for explaining the steps of the flow chart of FIG. 8: where

DETAILED DESCRIPTION OF THE INVENTION

Before the description of the present invention proceeds, it is to be noted that like parts are designated by like reference numerals throughout the accompanying drawings.

First Embodiment

Hereinbelow, one embodiment of the present invention is described in detail with reference to the accompanying drawings.

In describing the semiconductor chip manufacturing method according to the first embodiment of the present invention, the construction of the apparatus used for the manufacturing method is described first.

Figure 1:
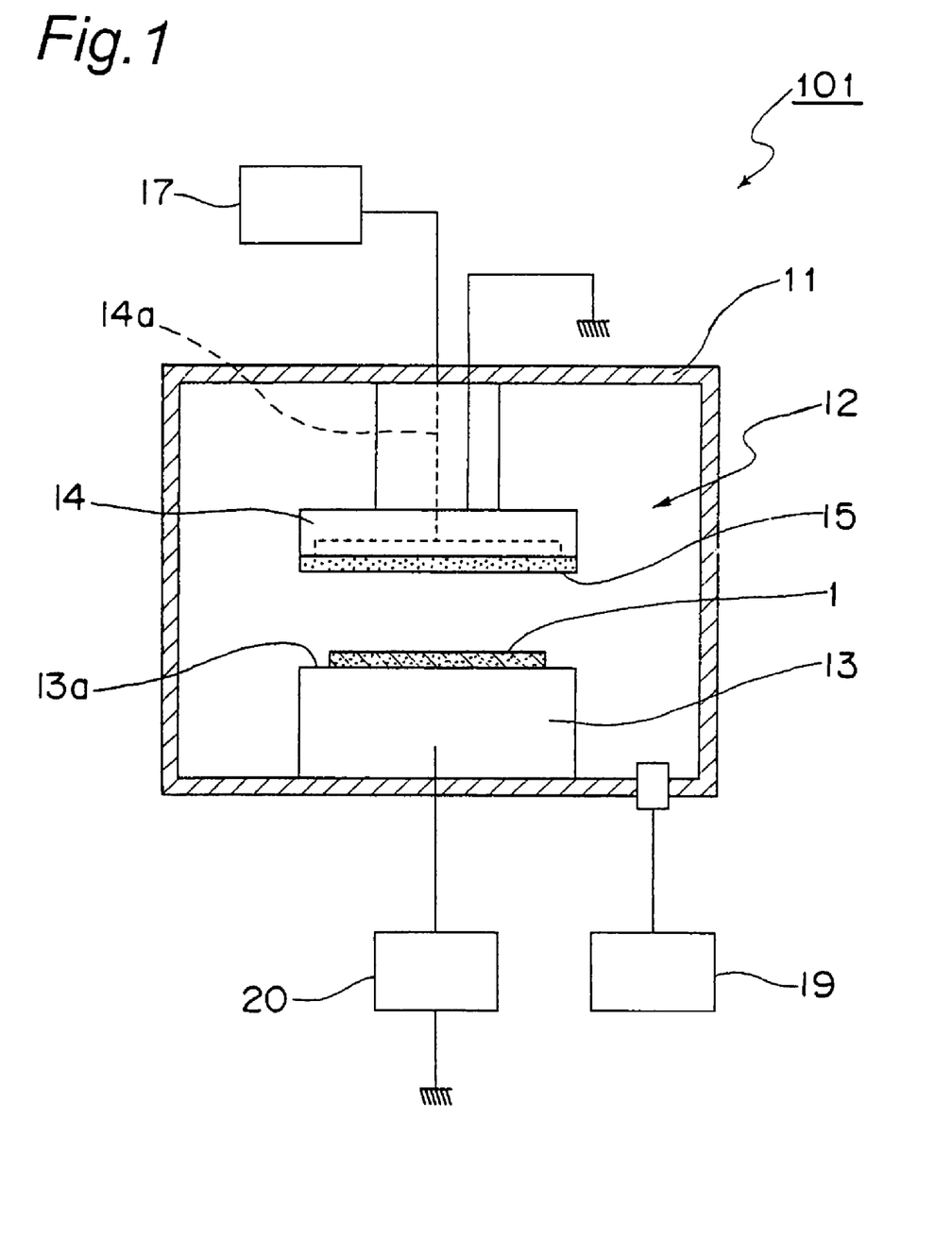
FIG. 1 is a schematic view showing the construction of a plasma processing apparatus according to one embodiment of the present invention.

According to the manufacturing method of the present first embodiment, a plasma processing apparatus 101 of one example of the semiconductor chip manufacturing apparatus that manufactures semiconductor chips by dividing a semiconductor wafer into a plurality of semiconductor chips. FIG. 1 shows a schematic structural view for schematically showing the construction of the plasma processing apparatus 101. The plasma processing apparatus 101 is the apparatus that performs plasma etching on a semiconductor wafer where semiconductor devices are formed in a plurality of device-formation-regions to thereby separate the device-formation-regions into individual pieces of semiconductor chips that include the respective semiconductor devices (plasma dicing process). First of all, the schematic construction of the plasma processing apparatus 101 is described below with reference to FIG. 1.

As shown in FIG. 1, the plasma processing apparatus 101 has a vacuum vessel 11 that forms therein a processing chamber 12 of a sealed space for carrying out plasma processing on the semiconductor wafer 1. A lower electrode (first electrode) 13 and an upper electrode (second electrode) 14 are arranged parallel oppositely to each other in the vacuum vessel 11. Moreover, a placement surface 13a on which a roughly disk-shaped semiconductor wafer 1 can be placed is formed on the illustrated upper surface of the lower electrode 13. Moreover, the placement surface 13a has a function to releasably suck and hold the placed semiconductor wafer 1 by vacuum suction or electrostatic suction. The lower electrode 13 is placed in the vacuum vessel 11 via an insulator, and the lower electrode 13 and the vacuum chamber 11 are mutually electrically insulated by the insulator.

Moreover, a gas supply hole 14a, which is a passageway for supplying a gas for generating plasma, is formed penetrating the inside of the upper electrode 14 in a space (discharge space) formed between the upper electrode 14 and the lower electrode 13. Moreover, in the upper electrode 14, one end of the gas supply hole 14a formed communicating with the outside of the vacuum vessel 11 is connected to a plasma generation gas supply unit 17 provided outside the vacuum vessel 11 and allows a fluorine based plasma generation gas containing, for example, carbon tetrafluoride ($CF_4$), sulfur hexafluoride ($SF_6$) or the like to be supplied from the plasma generation gas supply unit 17 into the processing chamber 12 through the gas supply hole 14a. It is noted that a gas flow rate regulating unit (not shown) that regulates the flow rate of the supplied gas to the desired flow rate is provided partway at the gas supply passage located between the plasma generation gas supply unit 17 and the one end of the gas supply hole 14a. Further, a porous plate 15 is provided on the illustrated lower surface of the electrode 14, and the plasma generation gas supplied through the gas supply hole 14a can be supplied into the processing chamber 12 so that the gas is uniformly applied to the semiconductor wafer 1 placed on the placement surface 13a of the lower electrode 13 via the porous plate 15.

Moreover, the plasma processing apparatus 101 has an evacuation pump 19 of one example of the evacuation device that reduces the internal pressure (i.e., evacuates) the processing chamber 12 to the desired pressure by evacuating the inside of the processing chamber 12. Moreover, a radio-frequency power supply unit 20 is electrically connected to the lower electrode 13, allowing a radio-frequency voltage to be applied to the lower electrode 13 by the radio-frequency power supply unit 20.

In the plasma processing apparatus 101 of the above construction, by placing the semiconductor wafer 1 on the placement surface 13a of the lower electrode 13, sealing the vacuum vessel 11, thereafter evacuating the inside of the processing chamber 12 by the evacuation pump 19 to produce a vacuum and applying the radio-frequency voltage to the lower electrode 13 by driving the radio-frequency power supply unit 20 in a state in which a prescribed amount of plasma generation gas is supplied from the plasma generation gas supply unit 17 into the processing chamber 12, a fluorine based plasma can be generated in the discharge space between the upper electrode 14 and the lower electrode 13. By applying the thus-generated plasma to the surface of the semiconductor wafer 1, the surface to which the plasma is applied can be etched (i.e., plasma etching is performed).

The semiconductor wafer 1 subjected to a plasma dicing process and the like in the plasma processing apparatus 101 is described next. For explanation, FIG. 2 shows a schematic plan view of a circuit-formation-face (first surface) 1a of the semiconductor wafer 1 on which the semiconductor devices are formed.

Figure 2:
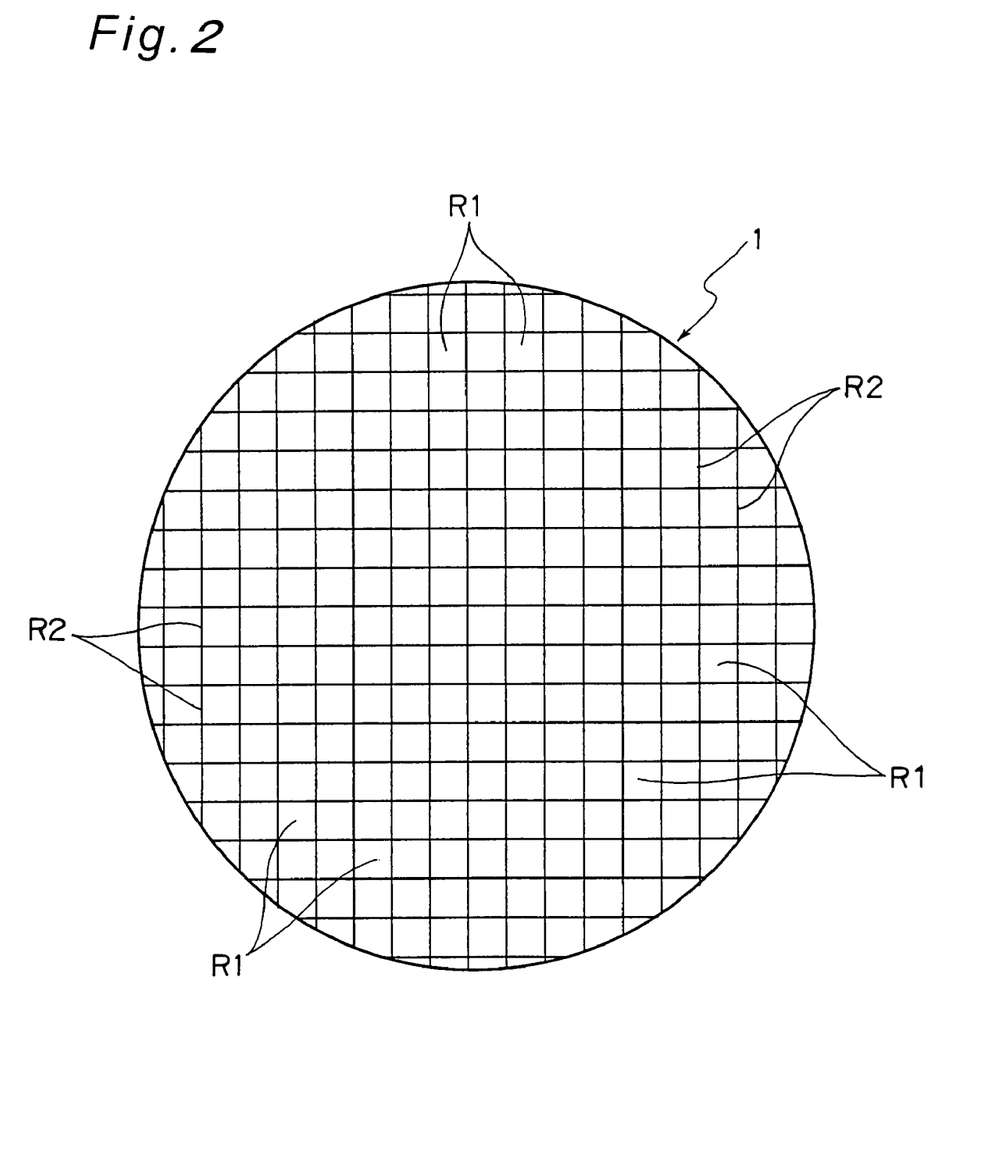
FIG. 2 is a schematic plan view of a semiconductor wafer handled in the above embodiment.

As shown in FIG. 2, a plurality of device-formation-regions R1 is arranged in a matrix form on the circuit-formation-face 1a of the semiconductor wafer 1. The device-formation-regions R1 have a size determined according to the size of the semiconductor chips to be manufactured and are arranged in, for example, rectangular regions. In this case, FIG. 3 shows a partially enlarged schematic plan view of the circuit-formation-face 1a of the semiconductor wafer 1, and FIG. 4 shows a schematic sectional view taken along the line A-A of the semiconductor wafer 1 of FIG. 3.

Figure 3:
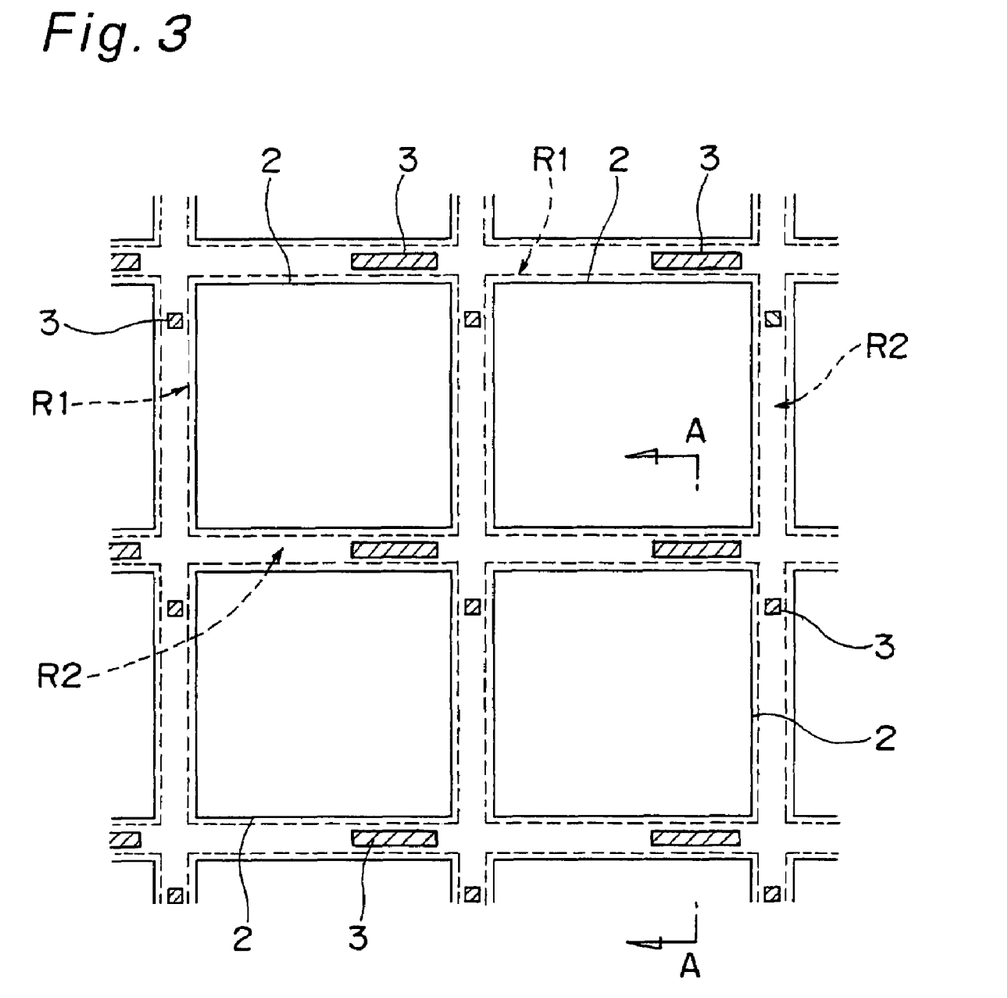
FIG. 3 is a partially enlarged schematic plan view of the semiconductor wafer of FIG. 2.

As shown in FIG. 3, dividing regions R2, which are roughly linear regions that have a prescribed width dimension (i.e., a region that has a width dimension sufficiently smaller than that in the lengthwise direction thereof), are arranged between the mutually adjacent device-formation-regions R1. The dividing regions R2 serve as the regions that are arranged in a roughly grating-like shape on the circuit-formation-face 1a of the semiconductor wafer 1 defining the device-formation-regions R1 and also serve as the frame-shaped regions arranged outside the peripheries of the device-formation-regions R1 with regard to the relation thereof to one device-formation-region R1. Further, the dividing regions R2 are located in dividing positions where the device-formation-regions R1 are separated into individual pieces in the plasma dicing processing described later. Moreover, each of the semiconductor devices 2 is formed in each of the device-formation-regions R1.

Figure 4:
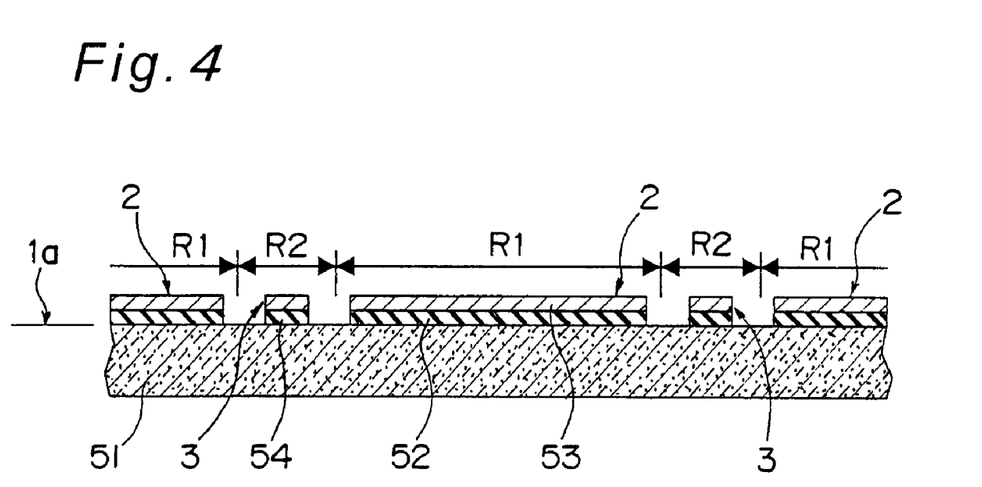
FIG. 4 is a sectional view taken along the arrow line A-A of the semiconductor wafer of FIG. 3.

In concrete, as shown in FIG. 4, the semiconductor wafer 1 is formed of a silicon substrate 51 that has a disk-like shape, and the semiconductor devices 2 are each formed by forming a device layer 53 via a silicon oxide 52 in a portion that corresponds to each device-formation-region R1 on the circuit-formation-face 1a. Moreover, TEGs 3, that is, "TEG" means "a Test Element Group", are formed in portions that correspond to the dividing regions R2 arranged between the mutually adjacent device-formation-regions R1 via a silicon oxide 54 on the circuit-formation-face 1a of the semiconductor wafer 1. Here, the TEG is the test patterns, which is designed in conformity to applications so that the characteristics and the shapes necessary for tests can be evaluated and arranged in places other than the device patterns when it is difficult to test the patterns on the actual devices and serves as the assembly of a plurality of patterns (test elements). Moreover, the TEG is the evaluation device, which is formed through the semiconductor chip manufacturing processes and formed of the materials of silicon and silicon oxide and also of a material (e.g., Al, AlSi, Al—Si—Cu, etc.) that contains a metal or an inorganic substance different from the materials.

Moreover, as shown in FIGS. 3 and 4, the silicon oxide 52 in each device-formation-region R1 and the silicon oxide 54 in each dividing region R2 are formed separated from each other. That is, the semiconductor devices 2 and the TEGs 3 are formed separated from each other, and, for example, minute spaces where no silicon oxide exists are existing between both of them. Moreover, the thus-formed TEGs 3 have various shapes, including those that have a roughly square planar shape and those that have a rectangular planar shape extending along the lengthwise direction of the dividing region R2. In FIG. 4, for example, the device-formation-regions R1 are each formed with a width dimension within a range of 1 to 20 mm, the dividing regions R2 are each formed with a width dimension of about 50 μm, and the TEGs 3 are each formed with a width dimension of about 30 μm.

Next, a sequence of semiconductor chip manufacturing processes including the dividing process of the semiconductor wafer 1 carried out by using the plasma processing apparatus 101 of the above construction is described below. For explanation, FIG. 5 shows a flow chart showing the procedure of the semiconductor chip manufacturing processes, and FIGS. 6A through 6D and FIGS. 7A through 7C show schematic explanatory views for explaining the procedure.

Figure 5:
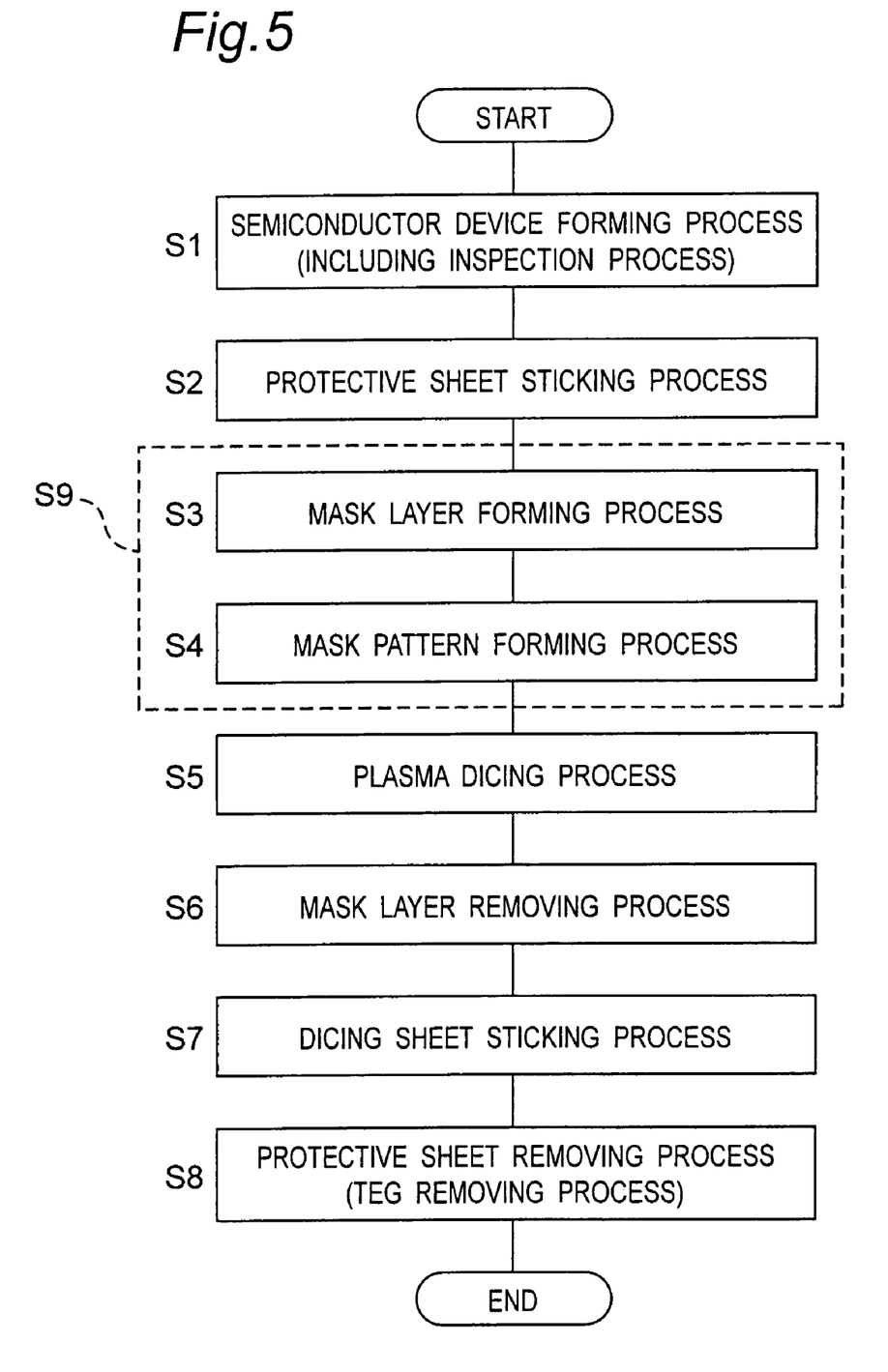
FIG. 5 is a flow chart showing the steps of the semiconductor chip manufacturing method of the above embodiment.

First of all, in step S1 of the flow chart of FIG. 5, by subjecting the circuit-formation-face 1a of the semiconductor wafer 1 to the processes of film formation, exposure, etching and so on as shown in FIG. 4, the semiconductor devices 2 are formed in the respective device-formation-regions R1 (semiconductor device forming process). Moreover, TEGs 3 are formed in the dividing regions R2 through the semiconductor device forming process. In the semiconductor device forming process as described above, various characteristics of the formed semiconductor devices 2 are inspected by using the TEGs 3 (inspection process).

Figure 6A:
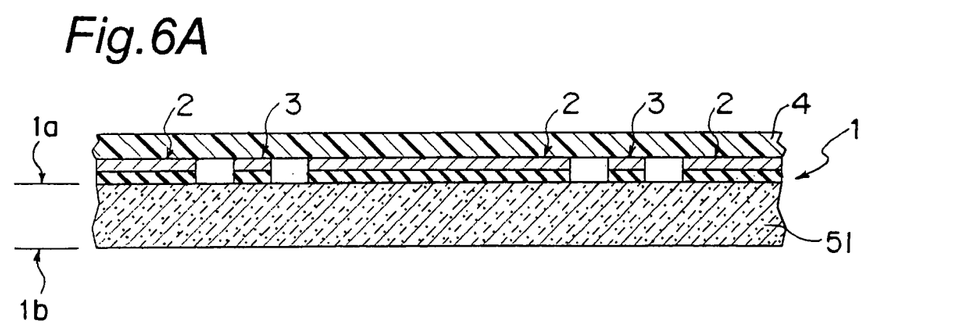
FIG. 6A is a view showing a state in which a protective sheet is stuck to the semiconductor wafer.

Next, as shown in FIG. 6A, a protective sheet 4 is peelably stuck to the circuit-formation-face 1a via an adhesive so that the circuit-formation-face 1a of the semiconductor wafer 1, which have completely undergone the inspection process, does not suffer damages during the processing subsequently carried out (protective sheet sticking process of step S2). Due to the semiconductor devices 2 and the TEGs 3 formed on the circuit-formation-face 1a, the protective sheet 4 is to be stuck onto the illustrated upper surfaces of the semiconductor devices 2 and the TEGs 3. It is noted that the protective sheet 4 to be used is shaped roughly into the same shape as that of the external shape of the semiconductor wafer 1 so as to cover the entire surface of the circuit-formation-face 1a and does not protrude outwardly of the edge portion of the semiconductor wafer 1. By using the protective sheet 4 of the shape described above, the possible occurrence of a damage that the protective sheet 4 protruding from the semiconductor wafer 1 is burnt by the plasma during the subsequent processing of, for example, plasma processing can be prevented.

Figure 6B:
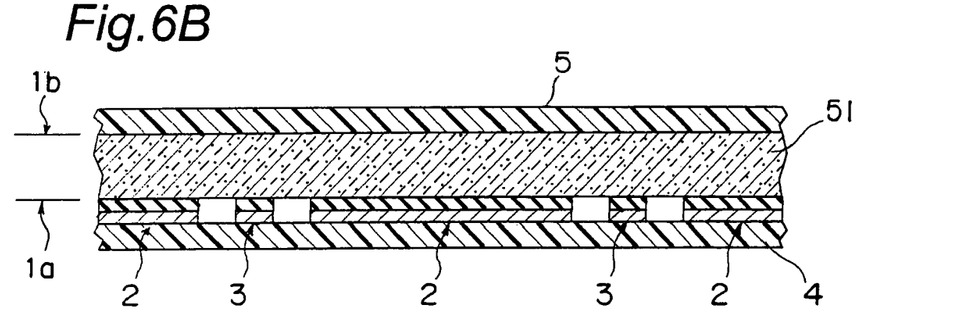
FIG. 6B is a view showing a state in which a mask layer is formed on the semiconductor wafer.

Next, in step S3 of FIG. 5, a mask layer 5 is formed on a processing-target-face 1b that is the surface (second surface) located opposite from the circuit-formation-face 1a of the semiconductor wafer 1 (mask layer forming process of step S3). The mask layer 5 is to form mask patterns to be used in the plasma dicing processing described later and is formed of a material that has a resistance to the plasma of a fluorine based gas, the material being, for example, aluminum or a resin (e.g., photosensitive resist). FIG. 6B shows a state in which the circuit-formation-face 1a and the processing-target-face 1b are inverted with respect to the semiconductor wafer 1 shown in FIG. 6A. Although the case where the mask layer forming process is carried out after the protective sheet sticking process is described in the present embodiment, it may be a case where a thickness reducing process for reducing the thickness of the semiconductor wafer 1 is carried out between both the processes instead of the above case.

When aluminum is used, a method for forming an aluminum thin film on the processing-target-face 1b by a deposition process, a method for sticking a foil-shaped aluminum thin film or the like is used. Moreover, when a resin is used, a method for sticking a resin formed in a film-like shape, a method for forming a mask layer by applying a resin in a liquid form onto the processing-target-face 1b by a spin coating method or the like and thereafter additionally carrying out a baking process or the like can be used.

Figure 6C:
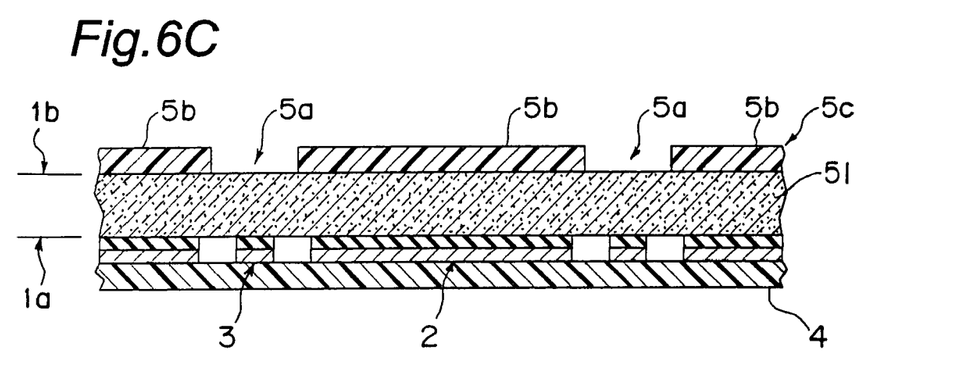

Next, as shown in FIG. 6C, the mask layer 5 is partially removed by laser processing to form the desired mask pattern (mask pattern forming process of step S4). The partial removal of the mask layer 5 can be achieved by using, for example, a laser beam and applying the laser beam to the mask layer 5 on the basis of the preset desired patterns. Moreover, patterns such that the mask layer 5 arranged in portions that correspond to the dividing regions R2 of the semiconductor wafer 1 is removed is formed as the desired patterns. Moreover, mask removal portions 5*a* for the dividing lines are formed by partially removing the mask layer 5 in the portions that correspond to the dividing regions R2 as shown in FIG. 6C by carrying out the mask pattern forming process. Moreover, masks 5*b* are formed of the remaining mask layer 5 from which the mask removal portions 5*a* have been removed, and mask patterns 5*c* are formed of the masks 5*b* and the mask removal portions 5*a*. The combinational process of the mask layer forming process of step S3 and the mask pattern forming process of step S4 serves as a mask forming process (S9) When the mask layer 5 is formed of a photosensitive resin, a method for forming the mask pattern through exposure and development can also be adopted.

Next, a method for forming individual pieces of semiconductor chips 10 including the semiconductor devices 2 by individually separating the device-formation-regions R1 by performing plasma etching on the semiconductor wafer 1 on which the mask patterns 5*c* have been thus formed is described (plasma dicing process (or plasma etching process) of step S5).

Concretely, in the plasma processing apparatus 101 shown in FIG. 1, the semiconductor wafer 1 is placed on the placement surface 13*a* of the lower electrode 13 via the protective sheet 4 with the processing-target-face 1*b* on which the mask patterns 5*c* are formed served as the upper surface. Subsequently, the vacuum vessel 11 is sealed, and the processing chamber 12 is internally vacuumed (e.g., about 100 Pa) by driving the evacuation pump 19. In addition, the gas of the regulated flow rate is supplied from the plasma generation gas supply unit 17 into the processing chamber 12 through the gas supply hole 14*a* and the porous plate 15. By applying a radio-frequency voltage to the lower electrode 13 by the radio-frequency power supply unit 20 in the above state, plasma can be generated in a discharge space located between the upper electrode 14 and the lower electrode 13.

The plasma generated in the discharge space is applied to the mask patterns 5*c* formed on the processing-target-face 1*b* of the semiconductor wafer 1 placed on the placement surface 13*a* of the lower electrode 13. By the plasma application, the plasma is applied to the surface of the processing-target-face 1*b* that corresponds to the dividing line mask removal portion 5*a*, or the exposed surface on which the mask 5*b* is not placed. By thus applying the plasma, the exposed surface of the processing-target-face 1*b* is etched.

Figure 6D:
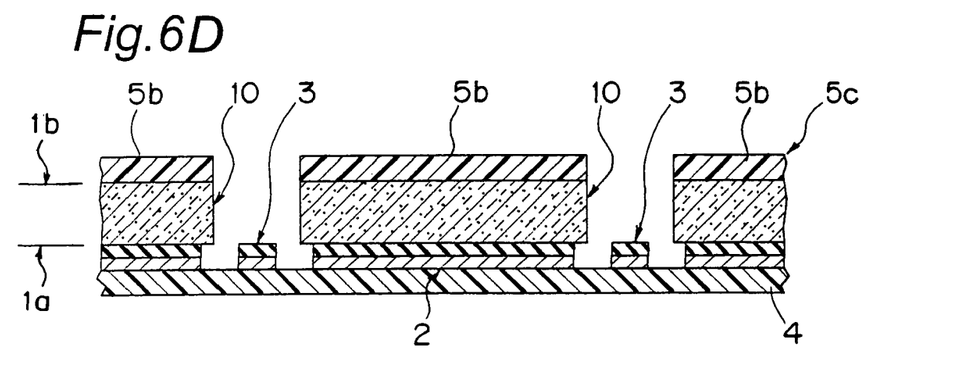
FIG. 6D is a view showing a state in which plasma dicing is performed.

By performing the plasma etching on the exposed surface of the processing-target-face 1*b* of the semiconductor wafer 1, the semiconductor wafer 1 is reduced in thickness in the portion that corresponds to the exposed surface, and the portion is finally removed. Through this process, as shown in FIG. 6D, the semiconductor wafer 1 is divided into individual pieces of the semiconductor chips 10 including the semiconductor devices 2 along the dividing regions R2.

For the plasma etching, for example, fluorine based plasma is used intending to remove the silicon and the silicon oxide. However, a reduced etching rate results with the TEGs 3 that are formed mainly of the material including metals and inorganic substances in the case of the etching using the fluorine based plasma, and therefore, the TEGs 3 remain unremoved (or other portion remains as a remaining portion as a consequence of the partial removal of the TEGs 3). Therefore, after the plasma etching is performed, as shown in FIG. 6D, only the TEGs 3 remain separated from the semiconductor chips 10 in the space between the semiconductor chips 10 separated into individual pieces, i.e., in the portion that corresponds the dividing regions R2. That is, the separation of the device-formation-regions R1 is achieved by performing the plasma etching, and the TEGs 3, which have been formed on the surface of the silicon substrate 51, are formed into individual pieces separated from the silicon substrate 51 as a consequence of removing its portion where the TEGs 3 have adhered to the silicon substrate 51. Therefore, the plasma dicing process is carried out by using the mask patterns 5*c* formed capable of concurrently carrying out the separation of the semiconductor chips 10 and the individualization of the TEG 3. In FIG. 6D, for example, the semiconductor chips 10 have a width dimension of 1 to 20 mm and a thickness dimension of 50 μm, and the TEG 3 has a width dimension of 30 μm and a thickness dimension of about 3 μm.

Figure 7A:
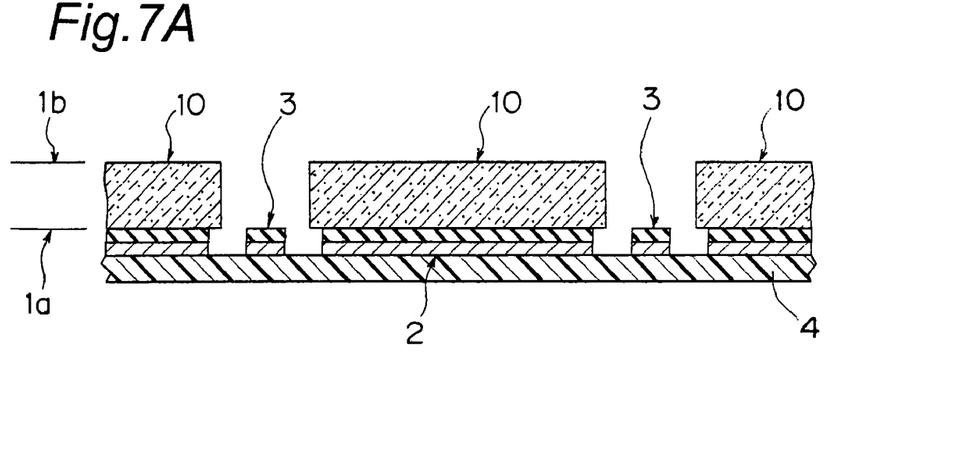
FIG. 7A is a view showing a state in which the mask patterns are removed.

Subsequently, as shown in FIG. 7A, the mask 5*b* that remains unremoved on the processing-target-face 1*b* of each of the separated semiconductor chips 10 is removed by carrying out, for example, an ashing process (mask layer removing process of step S6). Since the TEGs 3 are generally formed of a plurality of kinds of materials, the TEGs 3 are not removed even by the execution of the mask layer removing process and remain unremoved.

Figure 7B:
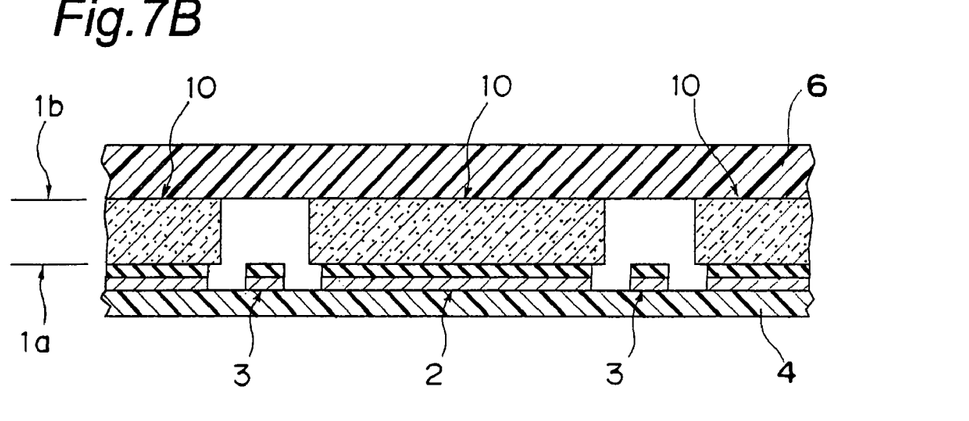
FIG. 7B is a view showing a state in which an adhesive sheet is adhesively placed.

Subsequently, as shown in FIG. 7B, an adhesive sheet (dicing sheet) 6 is stuck to the processing-target-face 1*b* of the semiconductor wafer 1 (dicing sheet sticking process of step S7). The adhesive sheet 6 has a size larger than that of the semiconductor wafer 1 and is fixed by a wafer ring (jig) (not shown) located at its periphery to hold the wafer ring, thereby allowing the semiconductor wafer 1 to be handled.

Figure 7C:
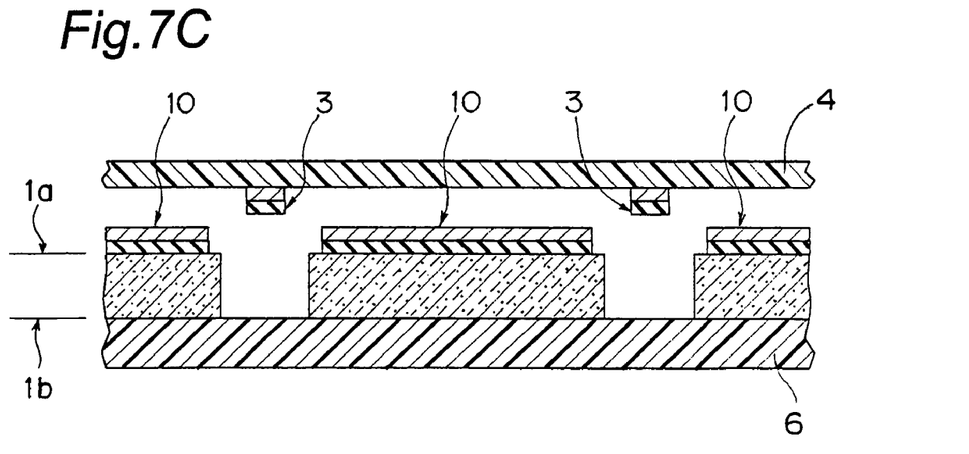
FIG. 7C is a view showing a state in which TEGs are removed together with removal of the protective sheet.

Subsequently, the protective sheet 4 that has protected the circuit-formation-face 1*a* of the semiconductor wafer 1 is peeled off. During the peeloff, the TEGs 3 that individually remain in the portions that correspond to the dividing regions R2 are put in a state in which they are supported only by protective sheet 4, i.e., stuck to the surface of the protective sheet 4. Therefore, the TEGs 3 are removed from the respective dividing regions R2 together with the peeloff of the protective sheet 4. The process of removing the TEGs 3 by peeling off the protective sheet 4 as described above can be referred to as a protective sheet removing process or a TEG removing process (step S8). Moreover, the operation of peeling off the protective sheet 4 may be carried out manually by an operator or carried out mechanically by a device of a robot or the like.

As a result, the semiconductor chips 10 are separated into individual pieces and arranged on the adhesive sheet 6 in a state in which no TEG 3 exists. The semiconductor chip manufacturing process is thus completed.

Although the semiconductor wafer 1 on which the mask patterns 5*c* have been formed is subjected to the plasma dicing by the manufacturing method of the semiconductor chips 10 capable of efficiently removing the TEGs 3 according to the above description, the present embodiment is not limited only to the case. Instead of the case, it may be, for example, a case where the plasma dicing is carried out without using mask patterns. Such a case is described below as a modification example of the present embodiment.

Figure 8:
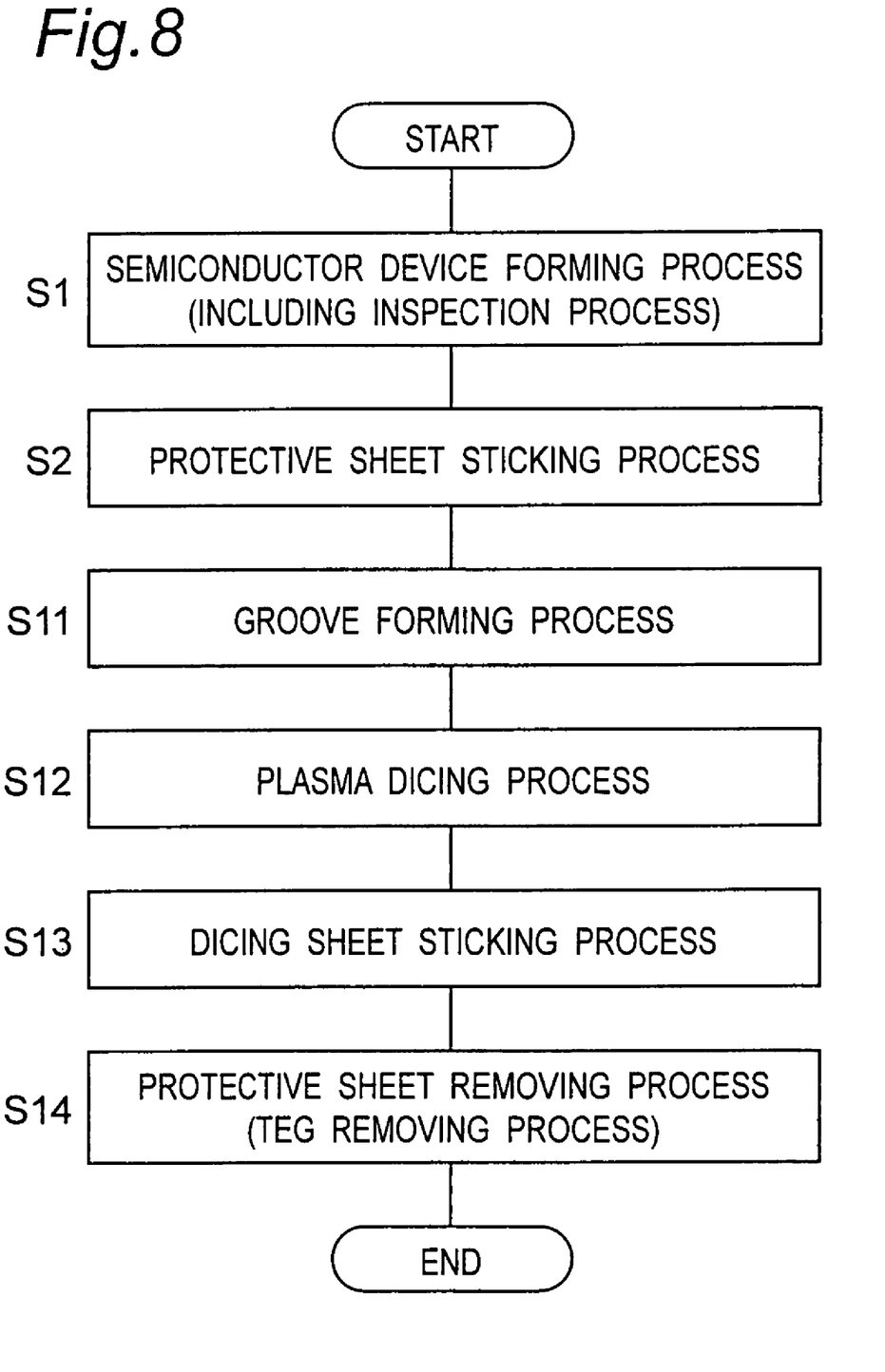
FIG. 8 is a flow chart showing the steps of a semiconductor chip manufacturing method according to a modification example of the above embodiment.

FIG. 8 shows a flow chart showing a sequence of procedure of the semiconductor chip manufacturing process according to the modification example, and FIGS. 9A through 9E show schematic explanatory views for explaining the processes of the procedure.

Figure 9A:
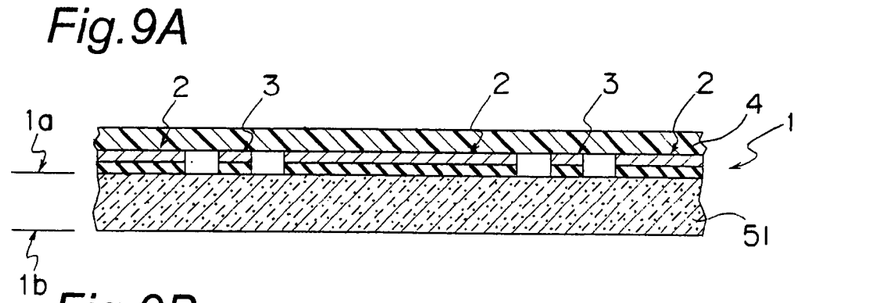
FIG. 9A is a view showing a state in which the protective sheet is stuck to the semiconductor wafer.

First of all, in step S1 of the flow chart of FIG. 8, semiconductor devices 2 and TEGs 3 are formed on the circuit-formation-face 1*a* of the semiconductor wafer 1. Subsequently, the protective sheet 4 is adhesively placed in order to protect the circuit-formation-face 1*a* (step S2). The state of the semiconductor wafer 1 is shown in FIG. 9A.

Next, dividing groove-portions 61 are formed in accordance with the dividing positions (i.e., dividing regions R2) of the semiconductor devices on the processing-target-face 1*b* of the semiconductor wafer 1 (groove forming process (half-cut dicing) of step S11). With regard to the formation of the groove-portions, the dividing groove-portions 61 can be formed by, for example, partially abrading off the processing-target-face 1*b* of the semiconductor wafer 1 by using a blade, for example, a disk type rotary blade. On the semiconductor wafer 1, the device-formation-regions R1 are arranged in a matrix form, and the dividing regions R2 are defined so that the device-formation-regions R1 can be individually separated.

Figures 9B, 9C:
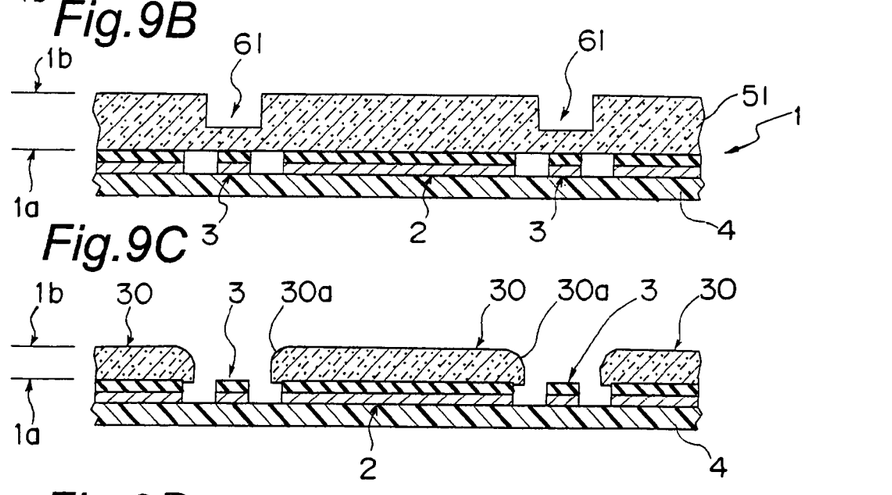
FIG. 9B is a view showing a state in which dividing groove-portions are formed according to the dividing regions.
FIG. 9C is a view showing a state in which plasma dicing is performed.

Moreover, as shown in FIG. 9B, the dividing groove-portions 61 are formed to have a depth dimension determined so that the bottom surfaces of the dividing groove-portions 61 do not reach the circuit-formation-face 1*a* (i.e., half cut is performed). The formation prevents the semiconductor devices from being separated into individual pieces by the formation of the groove-portions 61. In this case, the "dividing groove-portion" means a recess portion that is formed on the processing-target-face 1*b* of the semiconductor wafer 1 (i.e., silicon substrate 51) and of which the bottom surface does not reach the circuit-formation-face 1*a*. That is, a groove of which the bottom surface of the recess portion reaches (i.e., penetrates) the circuit-formation-face 1*a* is not referred to as the dividing groove-portion 61 in the present specification.

Moreover, the depth dimension of the dividing groove-portions 61 is determined to be not smaller than the thickness dimension of each of the semiconductor chips finally formed. In the present embodiment, the depth dimension of the dividing groove-portion 61 is set to 25 μm and the thickness dimension of the semiconductor chips finally formed is set to 25 μm with respect to the thickness dimension of, for example, 50 μm of the semiconductor wafer 1 reduced in thickness. Moreover, in this case, a distance dimension between the bottom surface of the dividing groove-portion 61 and the circuit-formation-face 1*a* can be determined within a range of, for example, 5 to 25 μm in consideration of a minimum distance dimension with which the shape of the dividing groove-portion 61 can be retained. Moreover, by carrying out a mechanical process like the groove forming process (step S11), a damaged layer where the applied stress remains is to be formed in the processing-target-face 1*b* of the semiconductor wafer 1 and in the vicinity of the inner surfaces of the dividing groove-portions 61.

As described above, a first reason for the fact that the lower limit of the distance dimension between the bottom surface of the dividing groove-portions 61 and the circuit-formation-face 1*a* is set to 5 μm is to secure the strength of the semiconductor wafer 1 after the half-cut dicing, and a second reason is to reduce the time during which the protective sheet 4 is exposed to the plasma. In order to remove the damaged layer formed on the processing-target-face 1*b* of the semiconductor wafer 1, it is required to remove the processing-target-face 1*b* at least by a thickness of 5 μm from the surface. However, if the distance dimension between the bottom surface of the dividing groove-portion 61 and the circuit-formation-face 1*a* is smaller than 5 μm, the dividing groove-portion 61 is disadvantageously removed before the damaged layer formed on the processing-target-face 1*b* is removed. Consequently, the protective sheet 4, which corresponds to the portions where the dividing groove-portions 61 have been formed, is to be exposed to the plasma at high temperature until the damaged layer of the processing-target-face 1*b* is completely removed. Therefore, the occurrence of the problem can be prevented in advance by preventing the dividing groove-portions 61 from being removed before the damaged layer of the processing-target-face 1*b* is completely removed, and the lower limit of the distance dimension between the bottom surface of the dividing groove-portions 61 and the circuit-formation-face 1*a* is defined to be not smaller than 5 μm.

Next, the semiconductor wafer 1, on which the dividing groove-portions 61 have been formed as described above, is subjected to the plasma etching for separating the semiconductor chips into individual pieces, i.e., plasma dicing (plasma dicing process of step S12). In the present modification example, the plasma dicing is carried out without forming a mask layer on the surface of the semiconductor wafer 1.

The plasma dicing in the case where the mask layer is not formed as described above can be carried out by a method similar to that of the plasma dicing in the case where the mask layer described above is formed in the plasma processing apparatus 101 shown in FIG. 1.

In the plasma processing apparatus 101, the generated plasma is applied to the entire processing-target-face 1*b* of the semiconductor wafer 1 placed on the placement surface 13*a* of the lower electrode 13 and to the inner surfaces of the dividing groove-portions 61. By thus applying the plasma, the entire processing-target-face 1*b* of the semiconductor wafer 1 and the inner surfaces of the dividing groove-portions 61 are etched (that is, etching is performed).

The thickness of the semiconductor wafer 1 is reduced in thickness by performing the plasma etching on the entire processing-target-face 1*b* of the semiconductor wafer 1, and the dividing groove-portions 61 are concurrently removed by performing the plasma etching on the inner surfaces of the dividing groove-portions 61. By thus removing the dividing groove-portions 61, the semiconductor wafer 1 is divided into individual pieces of the semiconductor chips 30 including the respective semiconductor devices 2 along the dividing positions (i.e., dividing regions) as shown in FIG. 9C. In this case, the fact that "the dividing groove-portions 61 are removed" means that the bottom surfaces of the dividing groove-portions 61 are brought close to the circuit-formation-face 1*a* by the etching performed on the bottom surfaces of the dividing groove-portions 61 and the bottom surfaces disappear by the final coincidence of the bottom surfaces with the circuit-formation-face 1*a*. That is, by removing the dividing groove-portions 61, penetration between the processing-target-face 1*b* and the circuit-formation-face 1*a* is achieved along the dividing regions on the semiconductor wafer 1.

Moreover, by performing the plasma etching as shown in FIG. 9C, the inner surfaces of the dividing groove-portions 61 are etched together with the processing-target-face 1*b*. However, since no mask layer is placed on the processing-target-face 1*b* unlike the conventional plasma etching, corner portions (edge portions) formed at the entrance edge portions of the dividing groove-portions 61 are similarly etched, and consequently the corner portions are removed, forming R-portions (that is, rounded portions) 30*a* of one example of the curved convex surface portion at the edge portions located on the processing-target-face 1*b* side of the semiconductor chip 30. Moreover, the edge removal is effected on the corner portions located at the roughly rectangular four corner portions in plane of each of the semiconductor chips 30 after the plasma etching, consequently forming the R-portions 30*a*. Although the etching is effected mainly in the thickness direction of the semiconductor wafer 1 by the plasma etching of the dividing groove-portion 61, the etching is slightly effected in the direction along the surface of the semiconductor wafer 1 due to the etching characteristic. The etching characteristic contributes to the formation of the R-portions 30*a*, it is desirable to determine the width dimension of the dividing groove-portion 61 in advance in consideration of the fact that the width dimension of the dividing groove-portions 61 is expanded by the etching.

Moreover, by performing plasma etching on the inner surface of the processing-target-face 1b of the semiconductor wafer 1 and the dividing groove-portions 61, the wafer is divided into the semiconductor chips 30, and the damaged layer generated by the mechanical processing can be removed. Moreover, as shown in FIG. 9C, the TEGs 3, which have been formed in the portions that correspond to the dividing regions R2, are separated from the silicon substrate 51 which is removed from the regions by the plasma etching and the TEGs 3 are remain individually in the dividing regions R2. That is, the TEGs 3 are separated into individual pieces by removing the fixation portions of the TEGs 3 to the silicon substrate 51 by the plasma etching. Taking the reliable separation of the TEGs 3 into individual pieces into consideration, the width dimension of the groove-portions 61 is preferably formed so as to become a dimension of not smaller than the width dimension of the fixation portions of the TEGs 3.

The completion of the plasma dicing in the plasma processing apparatus 101 is followed by stopping of the application of the radio-frequency voltage by the radio-frequency power supply unit 20, the supply of the gas from the plasma generation gas supply unit 17 and the driving of the evacuation pump 19. Subsequently, the vacuum vessel 11 is opened, and the semiconductor wafer 1 is taken out.

Figure 9D:
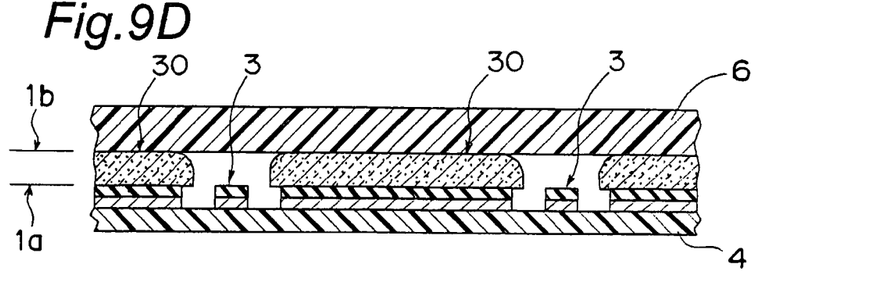
FIG. 9D is a view showing a state in which an adhesive sheet is adhesively placed.
Figure 9E:
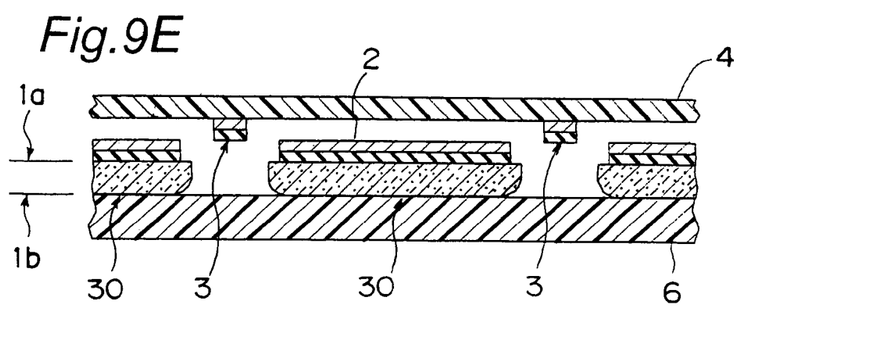
FIG. 9E is a view showing a state in which TEGs are removed together with removal of the protective sheet.

As shown in FIG. 9D, an adhesive sheet (dicing sheet) 6 is stuck to the processing-target-face 1b of the semiconductor wafer 1 taken out of the plasma processing apparatus 101 (dicing sheet sticking process of step S13). Subsequently, as shown in FIG. 9E, the protective sheet 4, which has protected the circuit-formation-face 1a of the semiconductor wafer 1, is peeled off (protective sheet removing process of step S14). When the protective sheet 4 is peeled off, the TEGs 3 stuck to the protective sheet 4 are removed from the dividing regions R2.

As a result, the semiconductor wafer 1 provided with the TEGs 3 can be separated into the individual pieces of the semiconductor chips 30, and the TEGs 3 that have been formed in the dividing regions R2 can be removed. Further, since the semiconductor chips 30 separated by the plasma etching are to have the R-portions 30a at the corner portions thereof, the transverse rupture strength of the formed semiconductor chips can be improved. Moreover, since there is no need to form a mask layer and remove the mask layer due to the formation in performing the separation by the plasma dicing, efficient plasma dicing can be carried out.

According to the embodiment, the TEGs 3, which are formed in the dividing regions R2 during the manufacturing process of the semiconductor chip 10 for the characteristic investigation, are formed of, for example, materials that contain metals and inorganic substances different from the materials of silicon and silicon oxide of the objective materials to be etched by the plasma etching besides the materials. Therefore, with regard to the conventionally problem that the TEGs 3 cannot be removed depending on the plasma etching for the individualization of the semiconductor chips 10, it is possible to separate the TEGs 3 from the respective semiconductor chips 10 by performing the plasma etching and thereafter remove the TEGs 3 adhesively stuck to the protective sheet 4 in contact with the sheet from the respective dividing regions R2 located between the semiconductor chips 10 by peeling off the protective sheet 4 adhesively stuck to the circuit-formation-face 1a of the semiconductor wafer 1 for the protection of the surface from the surface.

Therefore, even when the semiconductor wafer 1 is subjected to the dividing process by using the plasma dicing, it is possible to eliminate, the need for performing the plasma etching for the removal of the TEGs 3 by purposely changing the gas type and remove the TEGs 3 by only carrying out the operation of merely peeling off the protective sheet 4, so that the removal of the TEGs can be achieved through efficient operation.

Moreover, with the removal of the TEGs 3 rendered achievable by the method described above, by forming the TEGs 3 with being separated from the semiconductor devices 2 on the silicon substrate 51 of the semiconductor wafer 1, it is possible to remove by etching the silicon substrate 51 in the dividing regions R2 for the separation of the semiconductor chips 10 by the plasma etching and make the TEGs 3 independently stuck onto the protective sheet 4. Therefore, if the TEGs 3 and the semiconductor devices 2 are formed mutually separated, the width of the dividing regions R2 can be reduced close to the width of the TEGs 3, and the number of semiconductor chips 10 obtainable on the semiconductor wafer 1 can be increased.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2004-373022 filed on Dec. 24, 2004 including specification, drawing and claims are incorporated herein by reference in its entirety.

The invention claimed is:

1. A manufacturing method for semiconductor chips comprising:

sticking a protective sheet onto a first surface of a semiconductor wafer, the first surface having semiconductor devices placed in a plurality of device-formation-regions defined by dividing regions and a test element group (TEG) placed in the dividing regions and formed on the first surface, so that the sheet is brought in contact with the TEG;

placing a mask on a second surface of the semiconductor wafer, the second surface being located opposite the first surface of the wafer so as to define the dividing regions;

performing plasma etching on the second surface of the wafer after the protective sheet is stuck to the first surface and the mask is placed on the second surface, thereby removing portions corresponding to the dividing regions and then dividing the device-formation-regions into individual semiconductor chips, each individual semiconductor chip including an individualized semiconductor device; and removing a remaining portion of the TEG, which remains in the dividing regions and is stuck to the protective sheet, together with the protective sheet by peeling off the protective sheet from the semiconductor chips divided by the plasma etching, thereby manufacturing the individualized semiconductor chips.

2. The manufacturing method for the semiconductor chips as defined in claim 1, further comprising removing the mask from the second surface of the semiconductor wafer after the plasma etching is performed and before the TEG is removed.

3. The manufacturing method for the semiconductor chips as defined in claim 1, wherein
the performing the plasma etching includes separating the semiconductor chips into individual pieces and separating the TEG into an individual piece from the semiconductor chips.

4. The manufacturing method for the semiconductor chips as defined in claim 1, wherein
the performing plasma etching includes performing plasma etching on the semiconductor wafer which has a silicon substrate, the semiconductor devices and the TEG formed on the first surface of the silicon substrate, thereby removing the silicon substrate corresponding to the dividing regions, and then mutually separating adjacent semiconductor devices and separating the TEG from the silicon substrate.

5. The manufacturing method for the semiconductor chips as defined in claim 4, wherein
the placing a mask on the second surface of the wafer includes placing the mask so that a region on the second surface corresponding to a fixation portion of the TEG to the first surface of the silicon substrate is exposed from the mask, and then
the performing the plasma etching includes separating the TEG from the silicon substrate by removing the silicon substrate in the fixation portion of the TEG.

6. A manufacturing method for semiconductor chips comprising:
sticking a protective sheet onto a first surface of a semiconductor wafer, the first surface having semiconductor devices placed in a plurality of device-formation-regions defined by dividing regions and a test element group (TEG) placed in the dividing region and formed on the first surface, so that the sheet is brought in contact with the TEG;
forming groove-portions, along the dividing regions, in portions corresponding to the dividing regions on a second surface located opposite from the first surface of the wafer so that the groove-portions have depths shallower than a thickness dimension of the wafer;
performing plasma etching on the second surface of the semiconductor wafer on which the groove-portions are formed, thereby removing bottom portions of the groove-portions and then dividing the device-formation-regions into individual semiconductor chips, each individual semiconductor chip including an individualized semiconductor device; and
removing a remaining portion of the TEG, which remains in the dividing regions and is stuck to the protective sheet, together with the protective sheet by peeling off the protective sheet from the semiconductor chips divided by the plasma etching, thereby manufacturing the individualized semiconductor chips.

7. The manufacturing method for the semiconductor chips as defined in claim 6, wherein
the performing the plasma etching includes separating the semiconductor chips into individual pieces and separating the TEG into an individual piece from the semiconductor chips.

8. The manufacturing method for the semiconductor chips as defined in claim 6, wherein
the performing plasma etching includes performing plasma etching on the semiconductor wafer which has a silicon substrate, the semiconductor devices and the TEG formed on the first surface of the silicon substrate, thereby removing the silicon substrate corresponding to the dividing regions, and then mutually separating adjacent semiconductor devices are mutually and separating the TEG from the silicon substrate.

9. The manufacturing method for the semiconductor chips as claimed in claim 8, wherein
the forming groove-portions includes forming groove-portions so as to have width dimensions thereof greater than a width dimension of the fixation portion of the TEG to the first surface of the silicon substrate, and then
the performing the plasma etching includes separating the TEG from the silicon substrate by removing the silicon substrate in the fixation portion of the TEG.

* * * * *